United States Patent Office 3,594,229
Patented July 20, 1971

3,594,229

PLATED SUBSTRATE AND RELATED METHODS

John H. Kefalas, Waltham, Mass., assignor to Honeywell Inc., Minneapolis, Minn.

No Drawing. Filed June 29, 1966, Ser. No. 561,341
Int. Cl. H01f *10/02;* B44d *1/14;* B32b *15/16*
U.S. Cl. 117—237 15 Claims

ABSTRACT OF THE DISCLOSURE

A metallic film deposited on a sensitized and seeded thin gel coating on a non-metallic substrate adheres firmly to the substrate. The process requires no intermediate or final curing and the resultant article has high stability against degradation in many solvents including water.

The present invention relates to plated substrates and methods therefor leading to improved plating adhesion, wear resistance and the like; more particularly, the invention relates to an improved plastic substrate web for electroless deopsition of thin magnetic films.

A commonly vexing problem in the electroless plating of metal films upon non-metal substrates is that of securing adequate adhesion to the substrate. This is usually complicated by the requirement that the plated film exhibit good durability, wear resistance and the like, as well as good adhesion. Many solutions to this problem have been proposed; none appears completely satisfactory. For instance, in the electroless deposition of a thin magnetic film upon a flexible plastic web, workers have heretofore been required to expose the substrate to etching or a similar surface roughening in order to secure a satisfactorily adherent deposit. The present invention provides a novel improved substrate which facilitates an improved plated article exhibiting a surprisingly good film adhesion, durability, etc. The invention also eliminates the need for the usual etching or related substrate conditioning steps heretofore required. Moreover, the invention even provides superior adhesion over those methods which employ the usual pre-etching treatments.

One serious disadvantage with such etch conditioning, though it is not generally appreciated, is that the etching action makes it practically impossible to plate a substrate discontinuously, such as in a printed circuit pattern or the like. That is, it has been found that the etchants vigorously attack and remove photosensitive emulsions used to define the plating (e.g. printed circuit) pattern. This has heretofore prevented the plating of patterns on a non-metal substrate (that require such etching) in accordance with a photo-image. The invention, however, allows the marrying of such photo-imaging and electroless plating techniques, dispensing entirely with the need for etching. Thus, for instance, the invention can facilitate electroless plating of shaped, discrete magnetic films where this has been impractical before, especially on non-wettable plastic web.

Thus, it is an object of the present invention to provide an improved non-metal substrate for electroless plating and associated fabrication methods. A similar object is to provide such a substrate plated with thin films having improved adherence, wear-resistance and the like. Yet, another object is to facilitate electroless plating of such a substrate while eliminating the usual etching and related conditioning steps, if desired.

Still another object is to provide an improved electrolessly-plated substrate which is better adapted for discontinuous plating patterns. Still another object is to provide such a substrate allowing electroless plating of shaped discrete metal films using photo-imaging techniques.

These objects, features and solutions, as well as related ones occurring to those skilled in the art, may be accomplished by an embodiment of the invention illustrated and described below generally including a substrate comprising a flexible plastic web, on which a gel layer of prescribed thickness is provided, to be treated in an electroless plating arrangement, the gel being specified so that substantially none will dissolve at the onset of plating and such as will provide a thin metal deposit with a high adherence, good wear properties and the like.

This preferred embodiment will now be particularly described below with reference, first, to the structure thereof, and thereafter preferred electroless plating methods therefor. A preferred non-metal substrate is a polymeric film web, more particularly a tape comprising a linear saturated polyester film base coated with a water-permeable colloid upon which a thin magnetic layer may be electroless plated, as detailed in the examples below. For these examples, it is preferred to use a poly(alkylene) terephthalate film base, especially polyethylene terephthalate available under the trade names, "Mylar" and "Cronar" (both by Du Pont). "Estar" or "T–16" (by Kodak) may also be used, each base web being coated with a gel or other water-permeable colloid according to its characteristics.

Such polymeric film bases are mechanically strong, waterproof and dimensionally stable as well as being, in many forms, quite translucent and thus optically useful. Many such polymeric films are non-wetting and, in such a case, will derive special plating advantages from the aforementioned colloid coating. Related non-wetting polymeric films also deriving such advantages are cellulose acetate, polyvinyl chloride, polyvinyl acetate, polyvinylidene chloride, polyacrylonitrile, the copolymer of the monomeric compounds chiefly composed of the above-mentioned polymers, other polyesters like polyethylene terephthalate and modified derivatives thereof as well as a base matrix of cloth, paper or the like impregnated or coated with non-wetting resins like the above-mentioned.

The polymeric film base is to be coated, according to one feature of the invention, with a relatively hard, water-permeable colloid, particularly a gel or the like, before introduction into the electroless plating line. Such colloid coatings are especially advantageous upon the above-mentioned non-wetting films for good, adherent electroless plating thereof. For the electroless plating described in Example I, for instance, it was found quite satisfactory to use certain commercially available gel-coated "photographic" films, such as certain clear sub-coated "Cronar" base films by Du Pont (e.g. C–41; COS–7, "Cronar" Ortho-S Litho. film), heretofore used only for photographic work. However, I have found, as detailed below, that certain characteristics of a gel-coated film render it more receptive to electroless plating according to the invention. One may employ a relatively thin film comprised of a polyester base web coated, on the "plating-side," with a gel, or a like hard water-permeable colloid. The gel must be sufficiently hard, etc. so as not to dissolve readily in the pre-plating and plating dips. Other such colloids will suggest themselves to those skilled in the art, including polyvinyl alcohol, vinyl chloride, vinyl acetate, cellulose-derived gels and the like.

As an important feature, therefore, the invention will be seen to be useful for electroless plating of thin metal films onto polymeric film material or other non-metallic substrates to which a colloid coating like the aforementioned is applied. For instance, applicant has had considerable success, as seen below, electroless plating thin magnetic coatings (e.g. cobalt-nickel) onto gel-coated polyethylene terephthalate films. As noted below, the typical electroless plating baths and the gel-coated substrate to be plated therein according to the invention will be harmonized, where necessary, so that neither interferes with the operating characteristics of the other. For instance, the composition, temperature, time of immersion, etc. in the various plating, pre-plating and post-plating baths, may be specified to insure that the gel will not be wholly dissipated thereby; or conversely, the gel may be specified to be relatively insoluble therein.

As another feature of the invention, and contrary to prior accepted practice, I have found that such gelled substrates require no etching before immersion in electroless plating baths. Such etching customarily contacts the deposition-surface with a caustic agent, such as solutions of alkali metal hydroxides, for the delustering, hydrolyzing, etc. thereof. Though one may, if desired, use such etching pre-treatments with the gelled substrates of the invention in certain instances, it is significant that they are never required. Yet, a surprisingly superior adherence, wear-resistance, etc. are obtained in the metal coatings electroless plated thereon, superior even to prior art electroless-plated coatings which use these customary etching pre-treatments.

It will be evident to those skilled in the art that dispensing with these common etching steps is both novel and quite advantageous. A rather unobvious advantage, however, is that doing so allows one to employ photosensitive supercoatings on electroless plated substrates and thereby generate discrete magnetic coating patterns. That is, I have found, as another feature of the invention, that it is possible to supercoat such gel coatings with a relatively conventional photosensitive emulsion and develop patterns therein which establish discrete patterns of electroless plating.

A related feature of the invention is the teaching of a novel discrete electroless plating method for gelled films coated with photographic emulsions which include photosensitive silver compounds. More particularly, I have found it possible to control where such a film will be electroless plated according to where silver compounds are present on the surface thereof.

According to a further feature of the invention, I have found, unexpectedly that such gel coated films can be electroless plated with magnetic film coatings to have considerably improved scratch-resistance when the substrate film is pre-conditioned according to a prescribed etching treatment.

By way of example, applicant will discuss his invention in light of a specific process for plating various nonmetallic substrates as indicated below. However, it will be understood that the examples given do not, in themselves, limit the invention to the precise processes, conditions, ingredients or applications mentioned, but merely indicate illustrative embodiments enabling those skilled in the art to practice the invention, as defined within the scope of the appended claims and also suggest suitable equivalents to the materials and techniques taught by the invention.

EXAMPLE I

A thin magnetic film is electroless plated onto a gel-coated polyethylene terephthalate web known by the trade designation: "Clear Subcoated Cronar C–41" (by Du Pont). This substrate comprises a clear film web (tape) about 4 mils thick, coated on one side with a clear photographic gelatine on the order of about 50 micro-inches thick and has been conventionally employed merely for photographic purposes. A like gel or other water-permeable colloid may be used being substantially inert in electroless plating treatments and containing no metals, salts, etc. or the like which affect these treatments. This film is introduced continuously through an electroless plating line as follows.

(1) Sensitizing: The tape is conventionally unspooled from a supply reel by a take-up roll and continuously drawn through a number of plating treatment stations at about 10 inches per minute (for 1 micron plating thickness). Initially, the tape is introduced into an acidic, stannous sensitizing bath with pH about 0.2 known as "Enplate Sensitizer No. 430" (prepared by Enthone Co.—diluted 1:15 water). An equivalent sensitizer would include halide salts of tin and might also include a wetting agent, if desired. A titanous sensitizer may also be substituted. After about one minute immersion in the "Enplate" sensitizer at room temperature, the tape is run through two clean water rinses, flushing away all sensitizer residue to prevent it from contaminating following baths. As a means of adjusting the sensitizer immersion-time, the bottom rollers in the sensitizer tank are made vertically adjustable (in height) to thereby change the distance through the solution traversed by the tape, assuming a constant transport rate. Such an immersion-time adjustment may also be provided in subsequent dips. It has been noticed that the time/temperature of immersion for such film is somewhat critical and should not be greatly exceeded.

(2) Activation: The tape is next drawn continuously through an activating (or "seeding") solution of the type known as "Enplate Activator No. 440" (prepared by Enthone Co.—diluted 1:15 water); being immersed therein for about 30 seconds at room temperature. Substitute activators may comprise any halide salt of silver or palladium, e.g. an acidic solution of palladium chloride.

The aforementioned sensitizing and activation steps are of a type known in the art and may be modified or substituted for as recognized by those skilled in the art. For instance the sensitization step typically functions to sensitize the tape surface for subsequent adsorption of catalytic nuclei, the stannous ions [$Sn^{++}$] being adsorbed well into the gel. This adsorption may be increased by addition of a small amount of stannic ions [$Sn^{++++}$]. Also, following this sensitization and preceding a seeding activation dip (palladium), one may interject a "silver activation" dip in an aqueous solution of silver nitrate or the like acting to produce a strongly adherent deposit of isolated particles of silver, reduced by the adsorbed stannous ions. When this step is followed by immersion of the substrate in an acidic solution of palladium chloride, the silver particles are replaced by palladium particles which form the catalytic growth nuclei aforementioned. Furthermore, these sensitization and activation steps may be replaced by a single modified "sensitizing/seeding" step of immersing the substrate in a catalytic metal sol known in the art and referred to, for instance, in U.S. Patent 3,011,920. Such catalytic metal sols include both the sensitizing [stannous] material and the seeding [palladium] material, characteristically suspended (as a colloidal dispersion) out of reacting contact by an emulsifying agent to prevent their precipitating out of the sol; droplets of this suspension being adherently deposited upon the substrate. Immersion in this sol is characteristically followed by a "de-emulsifying" or accelerator, dip which acts to quickly release the sensitizing and seeding materials to react and effect the formation of growth nuclei as before so that electroless plating may occur thereon.

In the above-indicated pre-plating steps the various times of immersion are adjustable, although each will be long enough to insure complete treatment of the tape surface as understood by those skilled in the art. It will be appreciated that the consistency of the solutions, their concentration, temperature and the like, as well as the particular identity of the substrate film are somewhat variable within the skill of the art and that these parameters are interrelated as influencing the required time of immersion.

The seeding immersion is followed by two clean water rinses using cool, continuously-running water, preferably distilled. This is followed by a third rinse wherein the water is sprayed forcibly against the tape to prevent the introduction of activator material into the following plating solution and decomposing it. Spraying helps to dissipate bubbles of activator solution which were not rinsed away. This rinse also eliminates staining of the tape.

(3) Plating: The electroless plating is next performed by introduction of the tape immersingly through a set of tanks containing the plating electrolyte. The following aqueous electrolyte was used to plate a nickel-cobalt-phosphorous magnetic film about one micron (0.040 mil) thick onto the gelled tape. This magnetic thin film deposition is effected, as known in the art, by the autocatalytic reduction of nickel and cobalt source ions with hypophosphite ions serving both as a reducing agent and a source of phosphorous for the magnetic film alloy. Equivalent plating baths will readily occur to those skilled in the art. The ingredients are as follows (in grams per liter of aqueous solution).

Electrolyte:
50 $CoCl_2 \cdot 6H_2O$
30 $NiCl_2 \cdot 6H_2O$
40 $NaH_2PO_2$
50 Rochelle Salt
25 $NH_4Cl$
40 citric acid
Bath temperature range: 60°–95° C.—prefer 70–90° C.
Bath pH: 7.2–10.0
Immersion time: To yield prescribed thickness (1 micron)

Operating at a temperature of about 80° C., this preferred plating solution yielded a highly adherent, satisfactory continuous plate on the order of about one micron (40 micro-inches) in thickness in about 1–2 minutes plating time. As with the prior immersions, it is preferred that roller means be placed within the plating tanks to guide the substrate tape therethrough, these rollers being changed periodically to prevent undue build-up of plated material and consequent peeling and decomposition of the bath. The bath is heated and is recirculated to the plating tank past filtration means. Various other thin metal films may also be electroless plated in this manner, the superior adherence, etc. being especially advantageous for magnetizable metals such as cobalt, nickel, alloys thereof and including iron, phosphorous, sulfur, and the like.

(4) Finishing, testing: The plated tape is then tested and subsequently drawn through a clean water rinse and thereafter through a drying station (drip tank) for about three minutes to dry it sufficiently for storage on the take-up roll.

The results of the above-mentioned plating of the gel-coated tape are unexpected and may be characterized as uniformly "excellent,'" compared with the prior art. This plated tape is found to be unusually corrosion-free, not corroding after being immersed in water for as much as 48 hours; whereas analogous prior art tapes either completely dissolve or at least lose all adhesion after a soak of only about twelve hours. The magnetic properties of the plated film are excellent and adhesion to the substrate is outstanding, as is wear-resistance. Adhesion is superior to any known prior art plated tape, such as plain uncoated polyethylene terephthalate tapes, even when these have been pre-roughened by etching treatments or the like. For example, the tape plated according to this example will readily pass the "Cellophane Tape" adhesion test, where comparable prior art plating will not. Moreover, it shows no appreciable wear after many hundreds of thousands of passes against a magnetic read-head. For instance, with high bit density magnetic recording, a uniform readout can be maintained with less than 3% reduction of the signal after hundreds of thousands of passes against a (magnetic recording) "read-head." Further, the tape exhibits a very high (shiny) smoothness. The plating coverage is quite satisfactory, being continuous and uniform, with no stains and none of the many dropouts (plating voids) that have plagued prior art systems.

EXAMPLE II

A substrate like that of Example I is plated as there described, except for the substrate being somewhat modified to comprise a related Du Pont "#C–42" film, gel-coated on both sides and being processed in discrete strips, the plating being done by "batch," rather than "continuous," processing. In this case, the same superior plating results are derived on both gel-coated surfaces of the tape as was true on the single "gelled" plating surface in Example I.

EXAMPLE III

The plating steps of Example I are repeated using a related Du Pont "C–72" film with a 7 mil polyethylene terephthalate type base, gel-coated on both sides. As with the preceding examples the resultant plated film is outstanding.

By way of contrast, however, it will be noted that certain gel-coated films plate less satisfactorily. For instance, subjecting a "Kodacel #K–508" gelled film (by Kodak Co.) to the above-described electroless plating steps (Example I) yields an unsatisfactory plated film which is non-uniform and rather easily scratched. Moreover, the plating immersions are likely to dismember this film and contaminate the baths. The gel here, about 500 $\mu$-in. thick, is apt to peel away from the 5 mil "Acetate" base. This gel appears rather "soft," as well, being quite sensitive to temperature and humidity changes. It is believed that the coated thickness of the gel, or other water-permeable colloid, should be kept at less than about 500 $\mu$-in. thickness in this or related plating processes (Example IV corroborates this). One reason for this thickness limitation is believed to be the characteristic low tensile and shear strengths of such gels. Because of this, the gels provide good "interface-adherence" only when kept confined between the adhered-sheets (i.e. the relatively strong polymeric web and the plated metal film) so as to have a very small thickness therebetween relative to its length dimensions.

EXAMPLE IV

Using a gel-coated tape like those of Examples I–III, but supercoated with a photo-emulsion according to another feature of the invention, a like improved electroless plated film may be derived. Accordingly, a gel-coated base like those aforementioned is employed, being supercoated, on the gel, with a conventional photographic (photosensitive, photodevelopable) coating, namely a photo-emulsion layer including particles of silver halide salts suspended in a solid colloidal matrix. Thus, two coatings are deposited on the web base to comprise a composite gel/photo-emulsion layer about 150–250 $\mu$-in. thick. Preferably, this tri-part film comprises a "sub-coated Cronar #COS–7" film (by Du Pont) which is electroless plated as in Example I, except that a preliminary treatment is added. This film comprises a 7 mil Cronar base supercoated with gel/photo-emulsion layers aggregating approximately 200 $\mu$-in. thickness. This film substrate is treated as follows.

Step 1'—Preliminary fixing

Before Steps #1–#5 of Example I are performed, the photosensitive materials (i.e. silver compounds) in the photo-emulsion supercoating must be removed, e.g. with a suitable fixing agent. To do this, the film is kept unsensitized (in a "dark" container) and immersed in "#53–D All Purpose Developer" (by Du Pont) or the like, sufficient to remove the silver compounds. Some or all of the photo-emulsion may also be carried off.

Steps #1–#5 of Example I may now be performed. Very good plating results are derived, similar to those of Examples I–III, except that wear resistance might be a little inferior.

Alternatively, a Du Pont "#COS–4" film may be used, being identical with the aforementioned "COS–7" film except that the film base is 4 mils thick, with the same plating results being derived.

EXAMPLE V

The steps of Example I are repeated using gel/photo-emulsion film like that of Example IV but slightly modified. Thus, a Kodak "COA–4" film, with a 4 mil "Estar" base and a composite gel/photo-emulsion thickness of approximately 200 $\mu$-in., is selected. This film substrate gives the same good plating results as in Example IV, except that plating uniformity is slightly less and a slight staining may be evident.

Alternatively, a Kodak "#EO–4" film may be used, being substantially identical with "#COA–4" for these purposes.

It is noteworthy, however, that certain other related gel/photo-emulsion coated films plate rather unsatisfactorily using this electroless plating process. That is, a Kodak "Kodagraph #EC–4" type film having a gel/photo-emulsion layer approximately 500 $\mu$-in. thick on a 4 mil "Estar" base gives poor results, the plating being badly stained, very poorly adherent (fails "Cellophane tape test") and even exhibiting "bubbles," i.e. areas where the gel/photo-emulsion layer raises, lifting away from the web base. It is believed that the greater gel/photo-emulsion thicknesses account for this lifting (500 $\mu$-in. here, vs. from about 50 to about 200 $\mu$-in. for "good" plating, as above). Equally unsatisfactory is a related Kodak film "#EP–4."

EXAMPLE VI

Although certain gel-coated substrates are described above which, according to the invention, will electroless plate with surprising effectiveness without using a preliminary etch, I have found, according to another feature of the invention, that certain etching treatments may nonetheless be used therewith for deriving even greater improvement in adhesion, generally, and in scratch resistance in particular.

Thus, a Du Pont "clear subcoated Cronar #C–72" film is selected and is plated as in Example I, except that the following pre-plating etch treatment is performed just before "sensitizing" (Step 1—Example I).

Step 1–A—Pre-etch

The #C–72 film is run continuously (as before) through an etch/cleaner bath comprising an aqueous bath including about 240 gm./l. of "PC450" (by Enthone Co.), an alkaline additive, for about 2–5 minutes, sufficient to effect surface degreasing and initial etching of the gel coating. The film is then rinsed.

Step 1–B—Etch

The film is next drawn through a somewhat weaker etchant comprising an aqueous bath including about 120 gm./l. of Actane #82 (Enthone Co.), an acidic additive, for about 2 minutes, sufficient to complete etching and other surface conditioning of the gel-coated film. This is followed by another rinse. Both the "PC–450" and "Actane #82" etchant additives are best operated at less than 100° F., preferably at room temperature in this treatment.

When followed by the plating process of Example I (Steps 1–4 above) a plated film is derived which has even better adhesion and much better scratch resistance. Similar gelled substrates (e.g. those of Examples I, II) may be expected to similarly respond to such etching treatments.

It is noteworthy, however, that certain conventional etchants are not satisfactory for this purpose. For instance, a relatively strong acid etchant, namely Shipley "Conditioner #333" (Shipley Co.), commonly used to pre-etch an un-gelled polyethylene terephthalate type film, yields poor plating results and thus cannot be used with such "gelled films." It is belived that such strong etchants remove too much gel.

EXAMPLE VII

According to another feature of the invention the novel gel/photo-emulsion coated substrates of Examples IV and V above may also be used to electroless plate discrete (non-continuous) metal coating patterns, using convenient, advantageous photographic techniques for generating the patterns. It is new in the art to electroless plate non-continuously in a practical sense, as aforementioned, mostly because the customary pre-etching makes photo-resist masking means useless by removing it indiscriminately. Conventional electroless plating therefore is required to be continuous, as in the above Examples I–VI. Thus, the "#COS–7" film of Example IV is selected as a preferred film substrate coated with a non-photosensitive gel and a photosensitive emulsion and the following steps are performed to generate a prescribed selectable discrete plating pattern.

Step P–1—Negative imaging

A negative light image of the pattern is projected upon the photo-emulsion supercoating on the film so as to conventionally sensitize it and induce a latent image thereon at the intended "void" (or non-plating) areas, the plating areas being left unexposed and unsensitized. One may conveniently effect this by providing a pattern-conforming "positive-mask" over the film and then exposing the void areas to light radiation sufficient for thereafter developing the film.

Step P–2—Development

The imaged film is then immersed in a developing solution, namely Du Pont "#53–D, All Purpose Developer," or the like, which conventionally used (as in Step #1' above) will "develop" the photo-emulsion and also "fix" it, i.e. will reduce the sensitized silver halide compounds to free metallic silver (in the void areas) and also remove the unsensitized silver compound particles (in the plating areas). Such a developer may act to wash away most of the emulsion in the plating areas where no metallic silver is present. This leaves the plating areas somewhat white-looking and the void areas somewhat darkened and opaque, the free silver particles being made visible there.

Step P–3—Plating

The electroless plating steps of Example I are now performed and will be observed to form a discrete metal pattern, plating occurring only upon the unexposed areas, no plating occurring in the exposed, void areas. It is believed the presence of the free silver particles in the void areas prevents the sensitizer (Step 1) from adhering there adequately, thus preventing the following deposition of the activator (palladium nuclei) material on which, alone, the subsequent electroless plating will take place. In this manner, a discrete pattern is plated which nicely adheres to the gel in the unexposed areas (i.e. where the remaining unexposed silver was "washed" away); and leaves the exposed silver-containing areas (or voids) unplated.

It should be noted that in this electroless plating process, there is no etching or the like prior to the plating dip. Etching should be avoided, since typical etchants will destroy the discrete plating pattern. For instance, the etchants customarily used for prior art electroless plating will indiscriminately attack and remove all the photo-emulsion so that a continuous gel-coating would be left and continuous plating would thus occur, as in Example I. Thus, it is an important feature of the invention that discrete electroless plated patterns may be produced upon non-metallic substrates, and without the use of photo-resist treatments—something not feasible heretofore. Moreover, it is an important feature of the invention that such discrete electroless plating is facilitated by provision of a novel gel/photo-emulsion coated film substrate and an associated novel electroless plating method. It will be recognized that here, even more than with the aforementioned continuous plating, it is significant that the invention eliminates the need for preliminary etching steps heretofore common in the art.

Alternatively, in this example, one may substitute the "#COS–4," "COA–4," "EO–4" film substrates mentioned above, or a like gel/photo-emulsion coated film.

EXAMPLE VIII

According to another feature of the invention, and using the composite film substrate like that of Example VII, a similar discrete photo-imaged plating pattern is conveniently electroless plated according to a somewhat modified process as follows Here, however, the imaging is reversed, to expose and develop the plating areas (masking over the void areas) and, after etching away the emulsion layer there, to plate upon the underlying gel.

Step PD–1—Positive imaging

A positive light image of the pattern is directed against the photographic emulsion on composite "COS–7" film substrate described above, or its equivalent, so as to photosensitize the silver (halide) compounds in the plating areas, but not in the void (non-plating) areas. This sensitizing is a reversal of that in Example VII. Conversely to Example VII, a "negative-mask" may be used and sufficient light exposure provided to render these plating areas developable and etchable as described below.

Step PD–2—Development

The film is next drawn through a special developer solution, such as Du Pont "21–D" powder developer, Du Pont "Cronalith Code CLLD Litho-Developer" (Liquid), or the like Such developers, unlike that used in Step P–2 (Ex. VII), perform no fixing action, but leave the unsensitized emulsion (in the void areas) unaffected, and merely developing (reducing) the sensitized silver compounds in the plating areas, darkening the latter.

Step PD–3—Bleaching

The film is then rinsed and drawn through a prescribed "bleaching" solution, such as Du Pont "3–ES Bleach," or the like, for about 1 minute at room temperature. This bleach removes all the developed emulsion only (in plating areas only) leaving the gel exposed there, but substantially unaffected. This bleach also leaves the unsensitized, undeveloped (void) areas of the emulsion unaffected.

Step PD–4—Develop negative areas

The film is next unselectively exposed to thus photosensitize the "void" emulsion areas. Then the film is drawn through an All Purpose type developer, such as Du Pont "53–D" (see Step P–2 above) to develop and thus stabilize these void areas, the metallic silver particles thereby produced darkening the emulsion there somewhat. This step may be omitted in cases where the gradual darkening of void areas (upon continued exposure to light) is not objectionable.

Step PD–5—Plating

The film is then introduced through the "non-etching" electroless plating line described in Example I. As before, etchants will likely interfere with discrete plating since they would typicaly remove the emusion on the void areas, resulting in a mere continuous plating of the entire surface.

The above steps will have left "plate-able" gel areas and "non-plate-able" upstanding void (developed-emulsion) areas. A discrete pattern of metal may thus be electroless plated in the depressions left in the emulsion supercoat. This plated pattern has been formed using a positive photo-imaging technique (light-pattern conforms to, sensitizes "positive," i.e. plating, areas) as opposed to the negative photo-imaging technique in Example VII. Example VIII also yields a "sunken" plating pattern, with photo-emulsion "lands" in the void areas, as opposed to the raised plated "lands" of Example VII. However, these photo-emulsion "lands" may be removed as described in Example IX below.

Such discrete plating patterns are highly advantageous. For instance, they may comprise discrete tracks of thin magnetic films on a magnetic record substrate for "discrete track recording." Of course, the magnetic material may be plated in the grooves according to one form of the invention, and such depressed (in-groove) magnetic tracks will be recognized by those skilled in the art as very useful both for improving magnetic properties of the record and for improving performance of associated transducers. For instance, the photo-emulsion between adjacent tracks magnetically isolates adjacent magnetic "bits," reducing "cross-talk," adjacent bit interference and the like. The grooves can provide a valuable "air-bearing" effect, built right into the plated record itself. That is, the grooves can be formed to control the aerodynamics of the air flow over each track as the record is moved so as to produce an air bearing effect or cushioning, type of air flow suspending the magnetic head "flying" thereabove. Such grooves may also protect the plated track from damaging contact with the magnetic head. Thus, the cross-sectional volume defined by the track depression may be prescribed to provide a desired aerodynamic lift for a particular recording/readout system (head shape, weight and speed, etc.). Though such an "air-bearing" fluid flow has been used before, no satisfactory means for "channelling" the flow along the magnetic tracks themselves has heretofore been employed. The precise dimensional control possible with the invention is especially advantageous in such cases.

A related application is the plating of discrete magnetic "sub-tracks," where each magnetic "bit-track" comprises a number of thin, closely-spaced, parallel filamentary strips or very narrow "sub-tracks." Therefore, instead of plating each single magnetic "track" to be continuous across its width, a plurality of spaced filaments are plated across this width, each being separated by a prescribed narrow gap. It will be appreciated that use of the above discrete-pattern, electroless plating techniques may readily provide such a "multi-filament-track" magnetic record. It will be recognized by those in the art that very desirable advantages can be derived with such "multi-filament" tracks since, unlike single continuous tracks, they can provide "shape anisotropy" and also reduce skew and dispersion of magnetization. The result is improved signal output and higher bit densities.

An application related to this discrete track magnetic record is the shaping of flat thin films for magnetic memory applications, such as "read only memory" matrices and the like. In this application one or more metal "spots," preferably having a generally elliptical shape, are electroless plated onto the film substrate. As those in the art will appreciate, this highly desirable elliptical shape exhibits a minimum of (edge) demagnetization effects; however, it has been heretofore difficult to form accurately. The spots may be deposited as were the discrete tracks, the imaging pattern being easily adapted to produce these elliptical shapes, or any others.

EXAMPLE IX

Using the substrate of Example VIII, the process there is repeated, being slightly modified by an additional, post-plating, step to produce only discrete upstanding plated "lands," the emulsion in the void areas therebetween being removed as follows.

Step PD′–6—Remove "void coatings"

It is assumed that the film substrate has been exposed and developed such as indicated in Step PD–4 above to thereby photosensitize the emulsion in the void areas and to develope it. It is also assumed that the discrete electroless plating in Step PD–5 has been performed. This done, the plated film is then immersed in a bleaching solution, such as one of those described in Step PD–3 above (Example VIII). This will remove the "void emulsion," leaving the gel therebeneath exposed between the plated "lands." The "void" gel, may also be removed where desired, e.g. to provide higher plated "lands." The resultant "clad-like" plating areas, with unplated depressions therebetween, is novel in the art and those skilled in the art will recognize many valuable applications therefor.

Step PD″–6 (alternate)

Alternative to the treatment in Step PD′–6 above, optional Step PD–4 may be omitted leaving the "void-emulsion" substantially undeveloped. In this case, this "void-emulsion" may be later removed after the plating of Step PD–5 by etching away the void-emulsion. A relatively strong etchant may be employed so as to also remove the gel under this "void-emulsion."

Other significant advantages of such discrete magnetic plating will be evident to those skilled in the art. For instance, it will be apparent that discrete plaing increases the life of plating soltuions and increases their plating efficiency. The discrete electroless plating of the invention has many advanages over competing methods for forming discrete patterns of metal on a substrate, such as by depositing a continuous metal coating and then selectively etching away the unwanted portions. Such an etch can damage a substrate and the magnetic coating thereon; moreover, it provides relatively poor pattern resolution (line definition). Discrete electroless plating is thus safer and more accurate and is obviously more convenient and efficient. Further, with discrete magnetic films, it provides such superior resolution as to enable one to form narrow magnetic recording tracks on the order of 5 mils wide, thus greatly increasing bit density, etc. The invention also avoids the usual deleterious effects from etching plated magnetic material and resolution is superior, without the "ragged-edges" of prior art methods. For instance, resolution on the order of about 0.1 mil is possible. This, of course, contributes greatly to uniformity and control of magnetic properties and to a minimum of demagnetizing effects.

The invention is also superior to other prior art discrete deposition methods, such as vacuum-deposition using masks. Masking also is cheaper, more convenient and more accurate using the invention, as are the deposition methods which are, further, better adapted for on-line fabrication.

Other similar applications whereby discrete metallic deposit patterns are electroless plated on non-magnetic substrates according to the above-described methods will be apparent to those skilled in the art. It will, therefore, be appreciated by those skilled in the art that a limitless variey of patterns may be plated according to the invention, being formed photographically upon an emulsion-coated, gelled substrate and thereafter electrolessly plated selectively.

Other applications for the invention will be evident from the above description and the invention should not be considered as confined to the exemplary embodiments described. While the invention has been particularly shown and described with reference to the preferred embodiment thereof, it will be understood by those skilled in the art that various changs in form and details in constituent and steps in concentrations and in ranges may be made without departing from the spirit and scope of the claimed invention.

What is claimed is:

1. A magnetic recording medium comprising
a flexible substrate comprising a wetting-resistant poly(alkylene) terephthalate film; a thin magnetic deposit superposed upon recording surface portions of said film; and
at the interface between said film and said magnetic deposit, a large number of palladium particles substantially uniformly distributed over said surface portions and adhered firmly thereto, said particles being bonded thereon by a residue of a thin, water-permeable, relatively hard layer of gel material coated on said surface portions and free of metallic material other than said particles, said particles comprising the reaction product from contacting said gel coated portions of said film with a sensitizing bath and an activating bath prior to said plating.

2. A flexible magnetic reading medium comprising a thin film consisting essentially of poly(alkylene) terephthalate having at least one recording surface portion thereof and also having a thin layer of water-permeable colloid material provided adherently on said surface portion; a plurality of nucleating palladium particles adherently lodged in said colloid material, being distributed substantially uniformly thereacross; said colloid material being free of metallic material other than said nucleating particles; and a thin layer of magnetic material covering said palladium particles and said surface portion and being adherently bonded thereon through said colloid material, said palladium particles being disposed therebetween as nucleation sites.

3. A magnetic record having a nonmagnetic and nonmetallic substrate carrying a first pattern of information-storing magnetic material, and characterized by the improvement wherein
gelatinous material free of metallic material coats the entirety of said substrate intermediate said substrate and said recording material, particulate silver metal is secured on said gelatinous material in a second pattern that leaves said gelatinous material free of silver metal in said first pattern, and
metallic plating-nuclei particles of a material other than silver are seeded onto said gelatinous material in said silver-free first pattern, so that said seeded particles are intermediate, and contiguous with both, said magnetic material and said gelatinous material.

4. A method of depositing a thin metallic film upon a non-metallic substrate, said method comprising the steps of
providing at least a surface portion of said substrate with a relatively thin layer of water-permeable colloid material having at least a gel base portion contiguous with said substrate and essentially free of metallic material, and having a surface plating portion in the form of a photosensitive emulsion layer including photosensitive silver materials,
photographically processing said photosensitive material selectively to remove said silver material and thereby selectively expose said gel base portion,
sensitizing said colloid material by immersion in a sensitizing solution adapted to initiate adherent electroless plating only over the exposed base portion of gel material and not where silver metal remains in said emulsion layer, and
depositing said metallic film only upon said sensitized gel material.

5. The method as recited in claim 4 wherein said emulsion layer comprises a light-sensitive silver halide dispersed in a gelatin; and wherein said sensitizing solution includes a stannous ion equivalent.

6. The method as recited in claim 5 wherein said steps for selective removal of said silver material comprise photodeveloping the non-plating areas of said surface portion and not developing said plating areas thereof; and also washing said plating areas with a fixer solution adapted to remove said silver material there.

7. A method of depositing a thin metallic film on only selected surface portions of a non-metallic substrate with strong bonding thereto, said method comprising the steps of
providing on said substrate surface a thin substantially continuous coating of relatively inert hydrophilic gel free of metallic material,
providing a layer of photosensitive emulsion including photosensitive silver material over said gel,
photographically exposing said emulsion at selected surface portions and developing and washing said emulsion to remove said exposed silver material and thereby form depressions in the coatings to expose said gel in said selected surface portions while leaving silver in other portions, sensitizing said exposed gel material with a sensitizing solution for initiating adherent electroless plating only onto said surface portions of said substrate, and subjecting said coated substrate to electroles plating of said metallic film material to plate said film only onto said selected surface portions of said substrate, so that said plating is present only in said depressions in said coatings on said substrate.

8. The method defined in claim 7 wherein said substrate comprises a linear saturated polyester film, said steps of providing said gel and said emulsion on said substrate provide said layers with an aggregate thickness below that which induces lifting or other deformation during said sensitizing and plating treatments.

9. A composite magnetic recording medium comprising in combination:

a dielectric resin sheet, a thin layer of water-permeable colloid material superposed on recording portions of said sheet, said colloid material being free of metallic material except that it includes plating-nuclei in the form of metal particles adhered firmly therein at the surface thereof and distributed uniformly thereacross, and a thin film of magnetizable metal adhered to said colloid layer and said nuclei, said magnetic film comprising at least one metal selected from the group consisting of cobalt, nickel, iron and alloys thereof.

10. A laminated article comprising a non-metallic substrate, a metal-free gel film coating at least portions of a surface of said substrate, metallic plating-nuclei particles seeded onto said gel film, and an electrolessly-deposited metallic layer adhered to said seeded gel film.

11. An article as defined in claim 10 in which said gel film is less than 500 microinches thick.

12. An article as defined in claim 10 in which said gel film is less than 250 microinches thick.

13. An article as defined in claim 10 in which said gel film is sufficiently thin so as not to deform or bubble on being wetted with sensitizing, activating, seeding or plating solutions.

14. A laminated article having secure bonding between a deposited metallic layer and a non-metallic layer, said article comprising a non-metallic water-impermeable substrate, a metal-free gel film of water-permeable material coating at least portions of a surface of said substrate, metallic plating-nuclei particles seeded onto said gel film, and a metallic layer adhered to said seeded gel film, said layer being a magnetic material capable of magnetic information storage.

15. An electroless plating substrate film comprising a wetting-resistant polyester film, a thin layer of activated water-permeable gel material covering at least a surface portion of said film and being free of metallic material, and particles of nucleating metal distributed substantially uniformly over said gel material and firmly secured thereto, said gel and said particles being adapted for the electroless deposition of a magnetic information-storing metallic layer thereon with secure bonding thereto.

References Cited

UNITED STATES PATENTS

| | | | |
|---|---|---|---|
| 2,917,439 | 12/1959 | Liu | 117—71 |
| 3,123,492 | 3/1964 | Maffet | 117—34 |
| 3,245,826 | 4/1966 | Luce et al. | 117—240 UX |
| 3,223,525 | 12/1965 | Jonker et al. | 96—48 UX |
| 3,379,556 | 4/1968 | Chiecchi | 117—47 |

WILLIAM D. MARTIN, Primary Examiner

B. D. PIANALTO, Assistant Examiner

U.S. Cl. X.R.

96—35, 36, 36.2, 48; 117—34, 62, 71, 160, 239, 240